(12) United States Patent
Liegl et al.

(10) Patent No.: US 7,239,371 B2
(45) Date of Patent: Jul. 3, 2007

(54) DENSITY-AWARE DYNAMIC LEVELING IN SCANNING EXPOSURE SYSTEMS

(75) Inventors: Bernhard R. Liegl, Cold Spring, NY (US); Colin J. Brodsky, Salt Point, NY (US); Scott J. Bukofsky, Hopewell Junction, NY (US); Steven J. Holmes, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 11/163,409

(22) Filed: Oct. 18, 2005

(65) Prior Publication Data

US 2007/0085991 A1 Apr. 19, 2007

(51) Int. Cl.
*G03B 27/52* (2006.01)
*G03B 27/42* (2006.01)
*G03B 27/32* (2006.01)

(52) U.S. Cl. .............................. 355/55; 355/53; 355/77
(58) Field of Classification Search .................. 355/53, 355/55, 77; 430/5, 396; 250/548
See application file for complete search history.

(56) References Cited

U.S. PATENT DOCUMENTS

| 5,281,996 | A | 1/1994 | Bruning et al. |
| 5,742,067 | A | 4/1998 | Imai |
| 5,969,441 | A | 10/1999 | Loopstra et al. |
| 6,046,792 | A | 4/2000 | Van Der Werf et al. |
| 6,081,614 | A | 6/2000 | Yamada et al. |
| 6,172,757 | B1 | 1/2001 | Lee |
| 6,436,589 | B1 | 8/2002 | Smith |
| 6,882,405 | B2 * | 4/2005 | Jasper et al. ................. 355/55 |
| 2003/0107719 | A1 | 6/2003 | Chen |
| 2003/0160195 | A1 | 8/2003 | Kosugi |
| 2003/0218141 | A1 | 11/2003 | Queens et al. |
| 2006/0160037 | A1 * | 7/2006 | Brodsky et al. ............ 430/396 |

FOREIGN PATENT DOCUMENTS

JP 2003-124113 4/2003

OTHER PUBLICATIONS

English trranslation of JP 2003-124113 cited on Applicant's PTO-1449.*
U.S. Appl. No. 10/905,706, filed Jan. 18, 2005, Brodsky et al.

* cited by examiner

*Primary Examiner*—Alan Mathews
(74) *Attorney, Agent, or Firm*—DeLio & Peterson, LLC; John J. Tomaszewski; Ira D. Blecker

(57) ABSTRACT

A method and apparatus are provided for improving the leveling and, consequently, the focusing of a substrate such as a wafer during the photolithography imaging procedure of a semiconductor manufacturing process. The invention performs a pre-scan of the wafer's topography and assigns importance values to different regions of the wafer surface. Exposure focus instructions are calculated based on the topography and importance values of the different regions and the wafer is then scanned and imaged based on the calculated exposure focus instructions.

13 Claims, 4 Drawing Sheets

Exposure Slit Position

44 ⎯⎯⎯⎯⎯⎯⎯⎯ WAFER TILT OF INVENTION

42 ⎯ ⎯ ⎯ ⎯ ⎯ ⎯ CONVENTIONAL WAFER TILT

DENSITY-AWARE DYNAMIC LEVELING IN SCANNING EXPOSURE SYSTEMS

BACKGROUND OF THE INVENTION

1. Field of the Invention

This invention relates to the manufacture of semiconductor substrates such as wafers and, more particularly, to improving the leveling and consequently the focusing of the substrate during the photolithography imaging procedure of the manufacturing process.

2. Description of Related Art

The manufacture of semiconductor substrates such as wafers and chips involve the use of high-resolution lithography systems. In such systems, the patterned mask (i.e., reticle) is illuminated with radiation (e.g., laser radiation or radiation from an arc lamp) that passes through the illumination system and achieves high-degree illumination uniformity over the illuminated portion of the mask. A portion of the radiation that passes through the mask is collected by a projection lens, which has an image field of a given size. The projection lens images the mask pattern onto an image-bearing substrate or workpiece such as a wafer. The workpiece resides on a workpiece stage that moves the workpiece relative to the projection lens so that the mask pattern is repeatedly formed on the workpiece over multiple "exposure fields."

Lithography systems include an alignment system that precisely aligns the workpiece with respect to the projected image of the mask thereby allowing the mask to be exposed over a select region of the workpiece. Two types of lithography systems are typically used in manufacturing. One system is the step-and-repeat system, or "steppers" and the other is the step-and-scan system, or "scanner." With steppers each exposure field on the workpiece is exposed with a single static exposure. With scanners, the workpiece is exposed by synchronously scanning the workpiece and the mask across the lens image field. An exemplary scanning lithography system and method is described in U.S. Pat. No. 5,281,996, which is incorporated herein by reference. The following description will be mainly directed to the step-and-scan system although it will be understood by those skilled in the art that the invention is applicable to any type imaging system.

As is well known, in a typical photolithographic process, a thin layer of a photosensitive material or photoresist is deposited over a semiconductor wafer. During the photolithography process, illumination such as ultra-violet light is illuminated through a lens system and a photolithographic mask or reticle to the semiconductor wafer. The reticle has a particular device pattern and the pattern is exposed over a portion of the wafer by the illumination to create exposed and unexposed regions on the wafer. These exposed or unexposed regions are then washed away to define circuit elements on the wafer. This photolithography process is repeated many times on different layers of the wafer to define many circuit elements on the wafer. At the end of the photolithography process, the wafer having an exposed device pattern is cut into semiconductor chips.

Typically, a reticle is made from a transparent plate and has a device exposure region and an opaque region. The plate is often made of glass, quartz, or the like and the opaque chrome region typically includes a layer of chrome. The device exposure region generally has a square or rectangular shape and is positioned in the center of the reticle. The device exposure region includes transparent portions and opaque portions defining a device pattern. The transparent portions in the device exposure region allow illumination from a light source to travel through them and reach the wafer. On the other hand, the opaque regions of the device region block the light and the light does not reach the wafer.

FIG. 1 shows a typical prior art reticle 80 having a square device region 82 surrounded by an opaque chrome region 84. For the sake of simplicity, a device pattern 88 in the device region is not illustrated in detail in the figure. There is a kerf region 86 at the periphery of the device region 82 between the device region 82 and opaque chrome region 84. The kerf region 86 typically contains important information regarding the photolithographic process of the wafer and usually includes test structures to verify the performance of a photolithographic process. For example, the kerf region may include alignment marks to check the accuracy of the reticle alignment and registration marks to measure the resolution of the device pattern during the photolithographic process.

Lithographic imaging is highly dependent on substrate uniformity. A lithographic process can tolerate a small range of topography variation through the "depth of focus" inherent in the process capability. However, unanticipated topography variation on the substrate is a known problem for lithography processes and can result in a faulty imaging process and a rejection of the imaged workpiece.

Modern exposure systems such as the step-and-scan exposure system utilize an optical lens leveling system to control the height (focus) of the scanning slit above the wafer. The exposure tool can adjust to fluctuations in step-height by a set of simple linear motions. The problem arises when major step-height changes occur across the reticle field as shown in FIGS. 2A and 2B. Even sophisticated leveling systems are faced with a conflict on where to place the imaging focal plane relative to the uneven topography and, in general, trade-offs are made in some form of minimizing the average focus displacement across the imaging field.

On most product chips the pattern density on any one layer is generally not uniform. This can lead to discrete topography patterns after processing several physical layers due to the response of polishing and other processes to the varying pattern densities. Lithography tools, which often sample the wafer topography before or during exposure, try to respond to the topography and sometimes in an undesirable fashion. A typical response can be a tilt in the focus plane relative to the wafer, which follows the overall topography of a chip, but can yield unsatisfactory results on both levels of topography. This problem is valid for both step-only and step-and-scan systems. Although with step-and-scan systems, the focus response of the image tool may also be affected in time as the tool scans over different levels of topography. In principle, topography effects in the scanning direction can be corrected by a positional movement of the wafer relative to the exposure apparatus, but this can potentially lead to either loss of throughput or degraded focus performance.

Further, in many cases, the pattern density in the test kerf is quite different than the product chips. Beyond this, product chips may also vary within the imaging field. As mask set costs escalate, it is increasingly common for customers to share these costs by coordinating a variety of different chips onto one reticle, sometimes even coordinating with other customers. Since these chips may have quite different design purposes, there is further opportunity for non-uniform pattern density. These pattern density offsets can eventually lead to a step height due to film application and CMP polishing variations over the different densities. Since the leveling spots of the leveling mechanism of the scanning exposure system are sampling different step heights, a stage (and focus) tilt is created as the slit scans over these areas. If the simple linear tilt leaves significant residual focus errors, these focus errors can cause critical failures in the product.

Such errors are difficult to predict, identify, and correct. Often, problematic step heights develop during back-end processing as additional layers build up on the chip. Identification of missing patterns attributable to focus errors in many of these levels can be challenging. In many cases, critical failures are not found with conventional in-line inspection techniques. Traditional fixes include improving the overall process latitude (often not feasible if step heights are excessive, or fixing the CMP/design issues that cause the step height). In any event, either of these are costly and time consuming.

U.S. Pat. No. 6,081,614 to Yamada et al. relates to a surface position detecting method applicable to a slit-scan type or scanning exposure type exposure apparatus, for continuously detecting the position or tilt of the surface of a wafer with respect to the direction of an optical axis of a projection optical system. As discussed therein, the focusing of a mask image in these apparatuses continuously performs corrective drive for auto-focusing and auto-leveling during the scanning exposure process. A level and surface positioning detecting mechanism uses an oblique projection optical system wherein light is projected to the surface of a wafer obliquely from above and wherein reflection light from the photosensitive substrate is detected as a positional deviation upon a sensor. From the measured values of level during the scans a corrective drive amount is made to the level (height) and tilt of the wafer as the measurement position passes the exposure slit region.

FIG. 1 of the patent is reproduced here as FIG. 5 and shown as a fragmentary and schematic view of a slit-scan type projection exposure apparatus to which a surface positioning detecting method of the patent is applicable. The figure of the patent is included herein for clarity to describe how the subject invention relates to a typical lithographic apparatus which provides a wafer level adjustment. As shown in FIG. 5, a reduction projection lens 1 has an optical axis AX and an image plane which is perpendicular to the Z direction. Reticle 2 is held by a reticle stage 3 and a pattern of the reticle 2 is projected by the reduction projection lens. Denoted at 4 is a wafer having a surface coated with a resist and 5 is a stage on which the wafer is placed. The wafer stage S comprises a chuck for attracting and fixing the wafer 4 to the stage 5, an X-Y stage moveable horizontally along an X-axis and a Y-axis direction, a leveling stage moveable along Z-axis direction (same plane as the AX direction) and also rotationally moveable about the X and Y axes and a rotatable stage being rotationally moveable about the Z axis.

Denoted as numbers 10–19 in FIG. 5, are components of the detection optical system for detecting surface position and tilt of the wafer 4. A light source is denoted as 10 and 11 is a collimator lens for transforming the light from the light source 10 into parallel light having a substantially uniform sectional intensity distribution. Denoted at 12 is a slit member of a prism-shape having a plurality of openings therein (typically five or six) to form level sensing spots 72 (39) on the wafer. Denoted at 13 is an optical system which serves to direct the independent light beams from the pinholes of the slit member 12 to independent measurement level sensing spots points on the wafer surface by way of a mirror 14. These are also called leveling spots or sensors as shown as number 39 in FIG. 3A and number 72 in FIG. 2A.

Next, a structure for detecting reflection light from the wafer 4 is shown by the structure elements 15–19. Denoted at 16 is a light receiving optical system which receives the light beams from the wafer surface 4 by way of a mirror 15. Stop member 17 is provided within the light receiving optical system 16 and the light beams that pass through the optical system 16 have their axes parallel to each other and are re-imaged upon a detection surface of a photoelectrically converting means unit 19 by means of separate correction lenses of a correction optical system unit 18.

Tilt correction of stage 5 (and hence wafer 4) is made so that the measurement (leveling) points on the wafer 4 surface and the detection surface of the photoelectrically converting means unit 19 are placed in an optically conjugate relation.

Main control unit 27 serves to control the whole system and provides output for the reticle position controlling system 22, surface position detection system 26 and wafer position controlling system 25. When the reticle stage 3 is scanned in the direction of arrow 3a, the wafer stage 5 is scanningly moved in the direction of an arrow 5a. As regards the alignment of the reticle pattern in a Z-axis direction, the leveling stage of the wafer stage is controlled through the wafer position controlling system 25 on the basis of the result of the calculation of the surface position detection system 26 that detects height data of the wafer 4. Specifically, height data related to height spots defined in the scanned direction and adjacent to the slit are calculated and the wafer is tilted in a direction perpendicular to the scan direction as well as the height with respect to the optical axis AX direction.

The Yamada et al. patent improves the wafer positioning by measuring beforehand errors to be produced with respect to the level detection points due to a difference in pattern structure among the level detection points disposed along the scan direction. The measurement error with respect to each level detection point is then used to correct the position of the wafer using the surface position detecting system.

Positional information of the reticle stage with respect to the X and Y directions is measured continuously by projecting laser beams from reticle interferometer system 21 to mirror 20. Likewise for positioning the wafer stage 5, using wafer stage interferometer 24, wafer positioning controller 25 and mirror 23.

Publication No. U.S.2003/0107719 to Chen also discusses the problem of focus variation in wafer fabrication. In this publication a method for correcting improper leveling tilt comprises determining the improper leveling tilt induced by a leveling sensor of a semiconductor equipment improperly detecting a semiconductor wafer having an asymmetrical semiconductor pattern as out of horizontal and applies a corrective leveling tilt to compensate for the improper leveling tilt induced by the leveling sensor.

In U.S. Pat. No. 6,172,757 to Lee a wafer level sensor apparatus is disclosed using an electrically adjustable, two-directional zoom lens. The adjustable zoom lens provides field-by-field alignment on a stepper by providing a variable field view and depth of focus on the viewed field.

As noted above, the subject patent application is applicable to any such leveling system.

All the above patents are hereby incorporated by reference.

SUMMARY OF THE INVENTION

Bearing in mind the problems and deficiencies of the prior art, it is therefore an object of the present invention to provide a method for making semiconductor wafers utilizing an improved method for leveling of the wafer during the photolighographic process.

It is another object of the present invention to provide an apparatus for making semiconductor wafers utilizing an improved apparatus for leveling of the wafer during the photolithographic process.

Still other objects and advantages of the invention will in part be obvious and will in part be apparent from the specification The above and other objects, which will be apparent to those skilled in art are achieved in the present invention which is directed to, in a first aspect a method for making an integrated circuit device such as a wafer wherein one or more steps of the method requires a photolithography step which includes leveling of the wafer comprising the steps of:

loading a wafer into a wafer imaging photolithography exposure system;

pre-scanning the wafer to determine data on the topography of the wafer over different regions of the wafer;

assigning focus importance values to the different regions of the wafer;

calculating exposure focus instructions for the photolithography step based on the pre-scanned topography data and region focus importance values;

scanning and exposing the wafer based on the calculated exposure focus instructions; and releasing the wafer and unloading the wafer from the exposure system.

In another aspect of the invention an apparatus is provided for making an integrated circuit device such as a wafer wherein photolithography means are used to image the wafer during the making of the wafer comprising:

means for loading a wafer into a wafer imaging photolithography exposure system;

a photolithography exposure system including means to pre-scan the wafer to determine data on the topography of the wafer over different regions of the wafer;

means to assign focus importance values to the different regions of the wafer;

means to calculate exposure focus instructions for the photolithography step based on the pre-scanned topography data and region focus important values;

means for imaging the wafer; and means for releasing a wafer and unloading the wafer from the exposure system;

wherein during the photolithography imaging step of the process the wafer is exposed based on the calculated exposure focus instructions during which the wafer is positioned in the system based on the calculated exposure focus instructions.

In another aspect the focus importance values are determined based on the location of the product chip versus supporting kerf.

In yet another aspect the focus importance values are determined based on expected revenue per wafer area or other business driven factors for multi-chip reticles.

In a further aspect the focus importance values are determined based on yield limiting aspects known prior to processing the wafer.

In yet a further aspect the pre-scanning data are modified based on user input not limited to design density, yield data or revenue requirements of shared customer reticles.

In another aspect the exposure focus instructions are used only when the leveling errors exceed a user-defined threshold

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–5 of the drawings in which like numerals refer to like features of the invention.

Broadly stated, the present invention makes the chip design layout, in the form of chiplet coordinate data, available to the photolithography exposure tools leveling software which controls the leveling of the wafer during the exposure process (and, hence, the focus of the wafer). By being aware of these data and exposure focus instructions calculated based on these data during the scanning cycle, the tool, for example, can turn leveling sensors on and off as appropriate such that the product chip always receives the best process conditions at the expense of the test kerf or other less important portions (regions) of the wafer. The coordinates of the potential trouble spots in the different wafer regions are made available to the exposure tool's process program for that wafer level. The tool would then dynamically turn off the leveling spots as it passes over those areas. In this way, the tool's focus is being perturbed in the most critical areas of the chip.

More specifically, the step heights (and differences in wafer surface topography) caused by pattern density, test kerfs, macros, etc. may be detected by a pre-screening method in the exposure tool using typically leveling spots as described in U.S. Pat. No. 6,081,614, supra, to determine the topography of the wafer. Alternatively, any other suitable measurement techniques may be used to obtain this information prior to exposure. In FIGS. 2A and 2B and FIGS. 3A and 3B, the topographical pre-scan would have determined the different levels of topography. This information is used to calculate the exposure focus instructions.

Figure 2A:
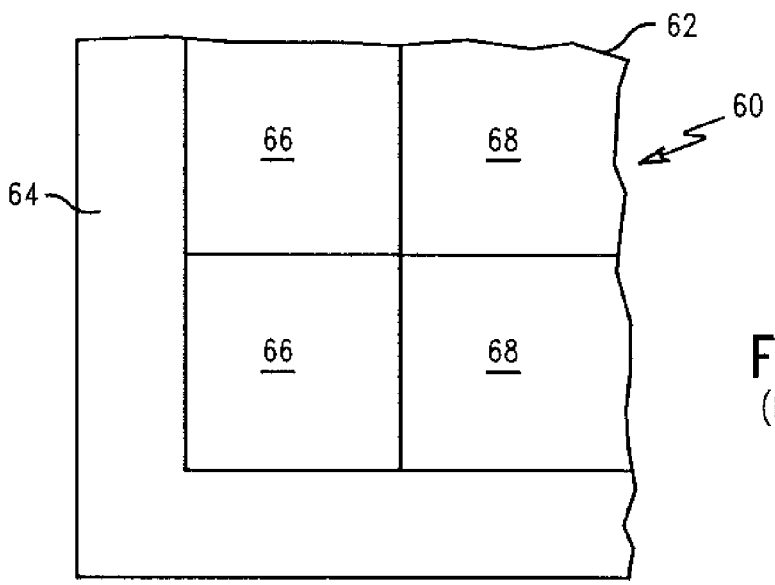
FIG. 2A shows a plan view of a portion of a wafer to be pre-scanned in a photolithography process.
Figure 2B:
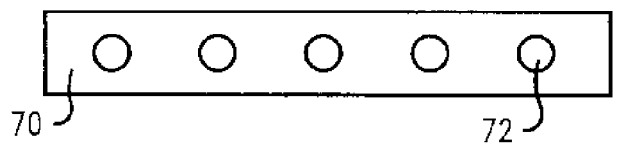
FIG. 2B shows a side view of the wafer of FIG. 2A.
Figure 2B:
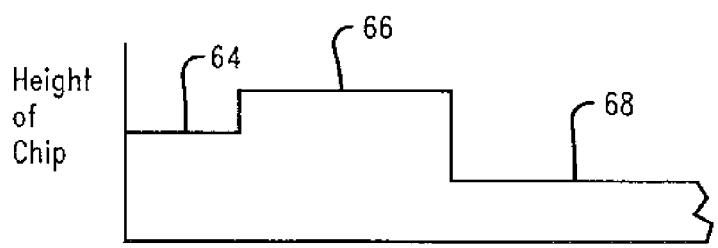

Referring to FIGS. 2A and 2B, a portion of a wafer 60 is shown as numeral 62 and has regions (chiplets) 64, 66, and 68. Region 64 is a test kerf region and 66 and 68 represent different regions of the wafer. A scanning slit is shown as numeral 70 having leveling sensing spots 72. See FIG. 5 where incident light rays impinge of the wafer surface forming leveling spots 72. In FIG. 2B, a side view of wafer 62 is shown and the varying heights across the wafer can be seen. Thus, test kerf portion 64 has one height, wafer portion 66 another height, and wafer portion 68 the lowest height. As will be more fully discussed hereinbelow with regard to FIGS. 3A and 3B, according to the subject invention values of importance are attached to the various regions of the wafer so that during the scanning exposure process the sensing (leveling) indicators 72 can be selectively shut off for the non-important regions thereby improving the level (tilt) of the wafer and focus for the important regions of the wafer.

Figure 3A:
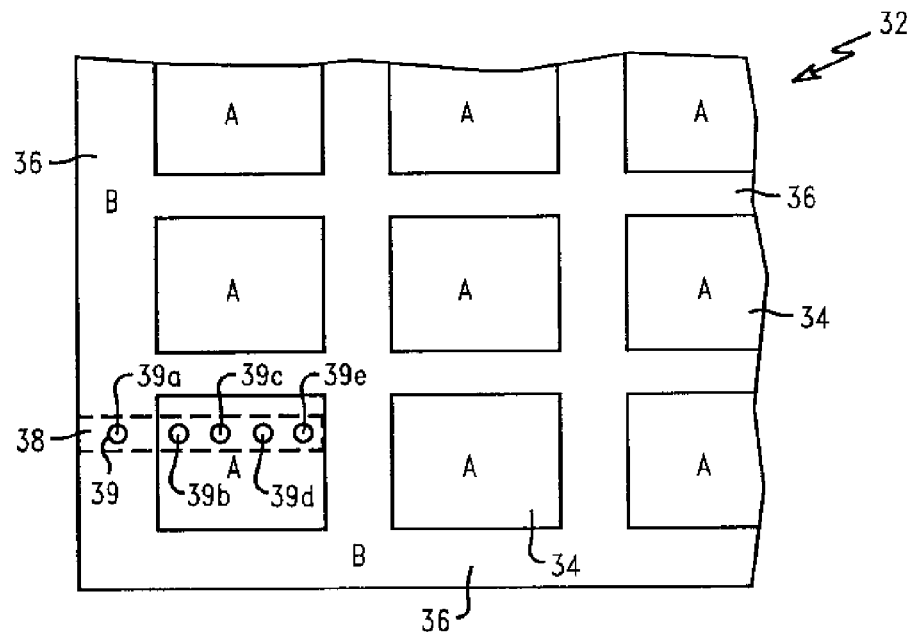
FIG. 3A shows a plan view of a portion of a wafer being pre-scanned in a photolithography process.
Figure 3B:
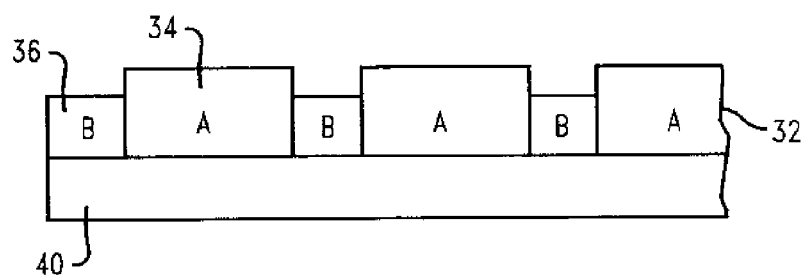
FIG. 3B shows a side view of the wafer of FIG. 3A including tilting of the wafer by the exposure system during the photolithography process.

Referring now to FIGS. 3A and 3B, a plan view of a portion of a wafer 32 is shown in FIG. 3A. The wafer 32 has regions 34 (shown by "A") and other region 36 (shown by "B"). A scanning slit 38 is shown moving in the direction of the arrow across a portion of the wafer 32 and also shows leveling five (5) spots 39 (39a–39e). In FIG. 3B a side view of wafer 32 is shown. The wafer 32 is on a leveling table 40 and the height of regions 36 (B) and 34 (A) are shown as being different. Any number of leveling spots can be used.

The region "A" is considered by the maker of the chip to be of high importance and the other region "B" with monitoring macros of lesser importance. In this case, the exposure instructions would be coded to initially pre-scan the entire imaging field topography. However, when determining the best-fit placement of the focal plane during the actual exposure and imaging of the wafer, only the leveling information obtained from the "A" region will be considered when, for example, the residual focus errors exceed a preset value. Alternatively, information from the "B" region could be mixed in with a lesser weight as compared to information from the "A" region. As will be appreciated by those skilled in the art, the wafer can be divided into many regions and "importance" values assigned to each region and the leveling sensors adjusted accordingly in any combination as the exposure scan is performed.

Figure 1:
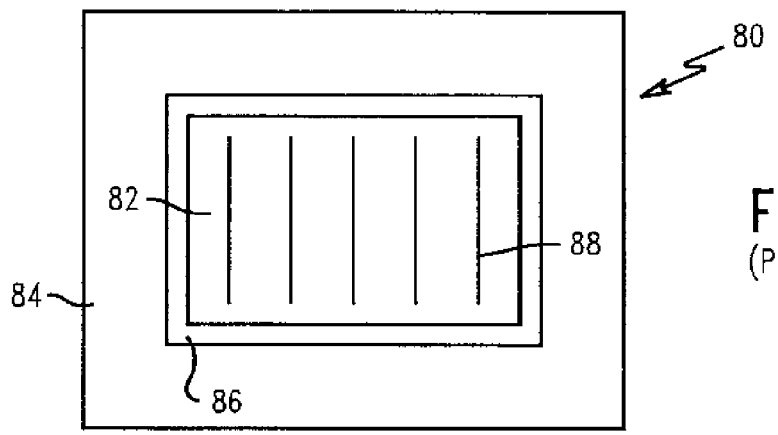
FIG. 1 illustrates a conventional prior art reticle used in semiconductor wafer fabrication.

Referring again to FIGS. 3A and 3B, FIG. 3A is a partial plan view of a wafer having chip areas A and monitoring macro areas B. Thus, the wafer shown generally as numeral 32 comprises a number of chip areas 34 (A) and macro areas 36 (B). An imaging slit 38 is shown moving in a direction of the arrow over a portion of the wafer. This imaging slit is used in combination with the scan apparatus to image the pattern reticle as shown in FIG. 1 onto the wafer 32. Leveling spots 39a–39e are shown as discussed above and for the pre-scan of the wafer the topography of the wafer would be determined as shown in FIG. 3B. Thus, four (4) leveling spots 39b–39e are shown over region "A" while one (1) leveling spot (39a) is over region "B." During the exposure scan the leveling spot 39a over region "B" can be deactivated thereby improving the tilt of the wafer as shown in line 44 of FIG. 3B. If the leveling spot is not deactivated, the wafer would be tilted conventionally as shown by line 42. As will be appreciated, depending on the topography of the particular region, any combination of deactivation of leveling spots may be employed. For example, leveling spots 39a and 39d could both be deactivated while 39b, 39c, and 39e remain activated.

In FIG. 3B, a side view of the wafer 32 is shown wherein the pattern height of the wafer 34 is shown higher than the monitoring macro areas 36. The wafer is shown on a wafer table 40. During the exposure imaging process using a conventional leveling apparatus, the wafer would be tilted as shown by dotted line 42 to maintain the wafer in "focus" during the imaging process. Using the method of the invention and deactivating the leveling spot 39a over region "B", the wafer would be tilted on a horizontal plane as shown by dotted line 44 and the wafer area A would be in focus as compared to the less important monitoring macro area 36 (B) which would be slightly out of focus.

As a result, the focal plane placement will be as close to perfect as possible for the "A" region, without systematic variation of the focus off-set across it. However, the focus placement for the "B" region in this case would be less than perfect. This will typically be acceptable, however, since the design pattern in the "B" region may be less sensitive to focus, possibly due to a lesser density of features, having caused the offset in topography in the first place. It is also within the scope of the invention to counter the defocus in the "B" region by applying a different pattern bias for this design area thus increasing the depth-of-focus and margin for focus offsets. This procedure can improve the process yield for the A region, if desired.

Figure 4:
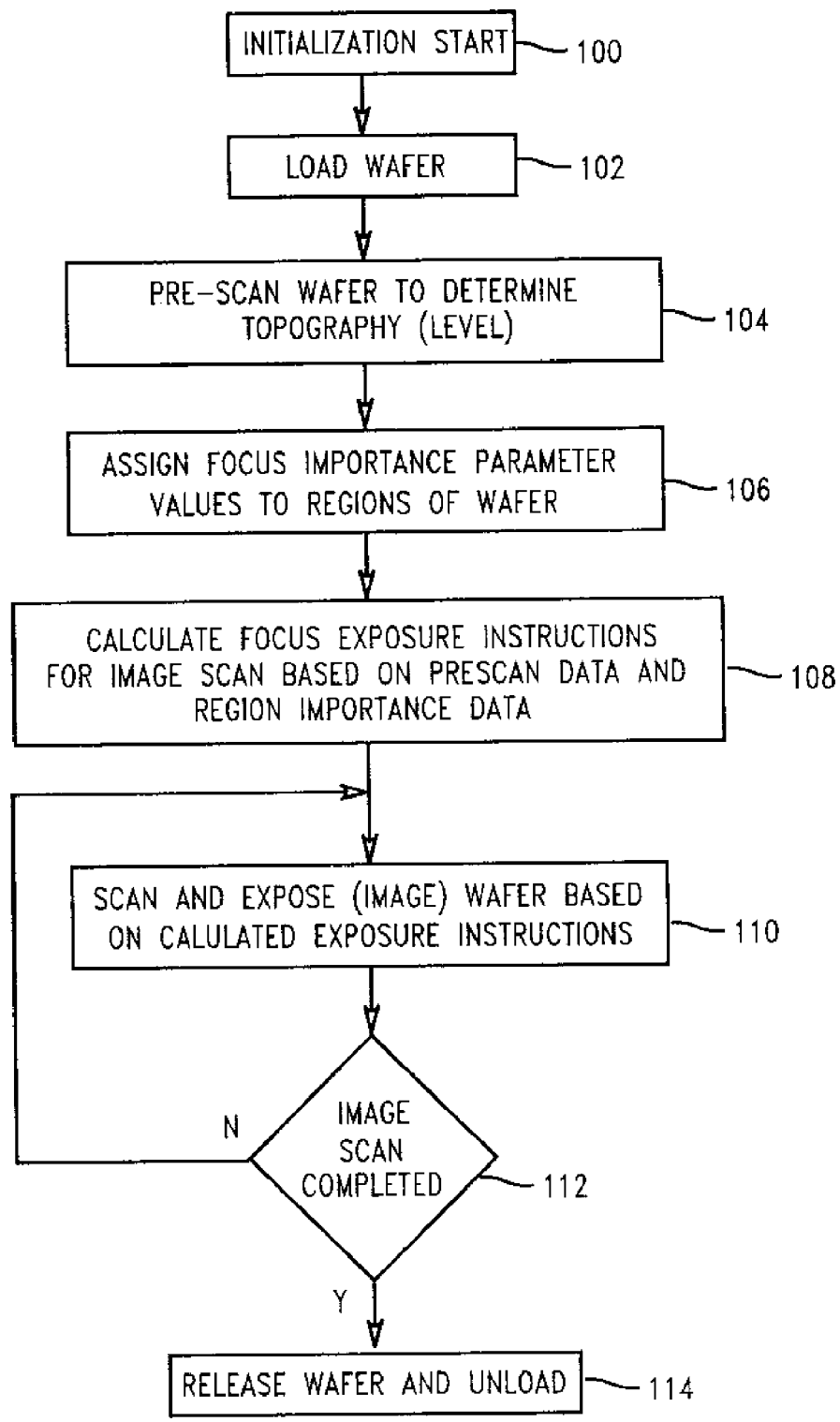
FIG. 4 shows a flow sheet of a method and apparatus of the invention.
Figure 5:
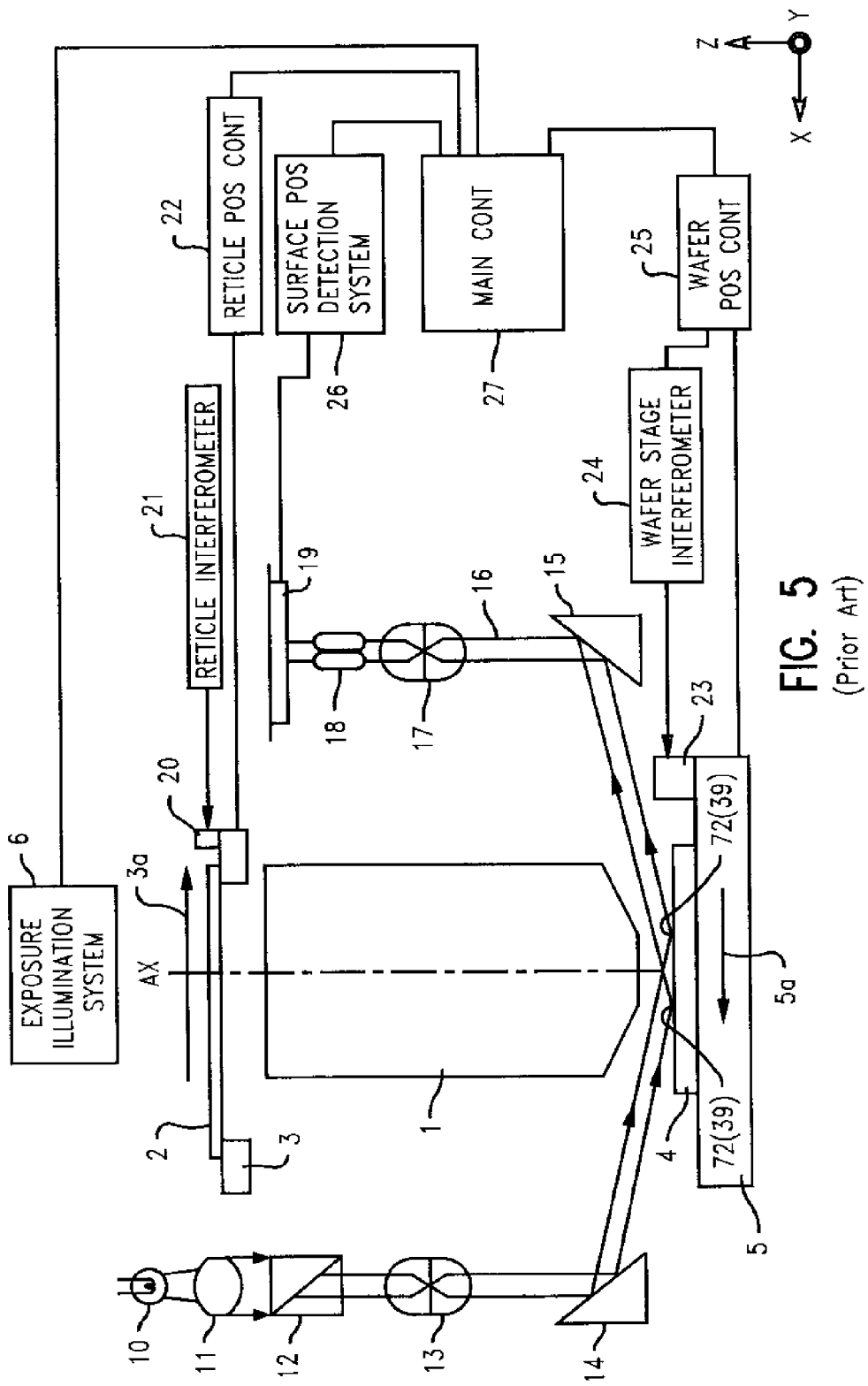
FIG. 5 shows a fragmentary and schematic view of a prior art slit-scan-type projection exposure apparatus utilizing a surface position detecting method.

Referring now to FIG. 4, the method and apparatus of the invention may be described. After starting at initialization step 100, the wafer is then loaded into the photolithographic system at step 102. The wafer is then pre-scanned in step 104 to determine the topography (height) over the different regions of the wafer surface. In step 106 focus importance parameters are assigned to the different regions of the wafer. As discussed hereinabove, some areas of the wafer are more critical or important than others and these would assigned a higher importance parameter level. For example, a kerf area or monitoring macro area would typically be of less importance than a chip portion and would be assigned a lesser value. Based on the pre-scanned data of step 104 and focus importance parameter data of step 106, the focus exposure instructions for the imaging process are calculated in step 108. In step 110 the wafer is scanned and exposed based on the calculated focus exposure instructions of step 108. This is continued over the wafer surface until the wafer is completely scanned as determined by step 112. After the imaging process is completed in step 112, the wafer is released and unloaded in step 114.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

Thus, having described the invention, what is claimed is:

1. A method for making an integrated circuit device such as a wafer wherein one or more steps of the method requires a photolithography step which includes leveling of the wafer comprising the steps of:

loading a wafer into a wafer imaging photolithography exposure system;

pre-scanning the wafer to determine data on the topography of the wafer over different regions of the wafer;

assigning focus importance values to the different regions of the wafer;

calculating exposure focus instructions for the photolithography step based on the pre-scanned topography data and region focus importance values;

scanning and exposing the wafer based on the calculated exposure focus instructions; and releasing the wafer and unloading the wafer from the exposure system.

2. The method of claim 1 wherein the photolithography exposure system is a step-and-scan system.

3. The method of claim 1 wherein the photolithography exposure system is a step-and-repeat system.

4. The method of claim 1 wherein an imaging slit containing a plurality of leveling spots is used to pre-scan the wafer in order to calculate the exposure focus instructions.

5. An apparatus for making an integrated circuit device such as a wafer wherein photolithography means are used to image the wafer during the making of the wafer comprising:
    means for loading a wafer into a wafer imaging photolithography exposure system;
    a photolithography exposure system including means to pre-scan the wafer to determine data on the topography of the wafer over different regions of the wafer;
    means to assign focus importance values to the different regions of the wafer;
    means to calculate exposure focus instructions for the photolithography step based on the pre-scanned topography data and region focus important values;
    means for imaging the wafer; and
    means for releasing a wafer and unloading the wafer from the exposure system;
    wherein during the photolithography imaging step of the process the wafer is exposed based on the calculated exposure focus instructions during which the wafer is positioned in the system based on the calculated exposure focus instructions.

6. The apparatus of claim 5 wherein the photolithography exposure system is a step-and-scan system.

7. The apparatus of claim 5 wherein the photolithography exposure system is a step-an-repeat system.

8. The apparatus of claim 5 wherein the photolithography exposure system uses an imaging slit containing a plurality of leveling spots to pre-scan the wafer to determine the data and the leveling spots are adjusted in any combination during the exposure based on the calculated exposure focus instructions.

9. The apparatus of claim 5 wherein focus importance values are determined based on knowledge of the location of product chip versus supporting kerf.

10. The apparatus of claim 5 wherein focus importance values are determined based on expected revenue per wafer area.

11. The apparatus of claim 5 wherein focus importance values are determined based on yield limiting aspects known prior to processing the wafer.

12. The apparatus of claim 5 wherein the pre-scanning data are selectively filtered based on user input not limited to design density yield data or revenue requirements of shared-customer reticles.

13. The apparatus of claim 5 where exposure focus instructions are performed only when leveling errors exceed a user-defined threshold.

* * * * *